(12) United States Patent
Hasegawa et al.

(10) Patent No.: US 8,643,393 B2
(45) Date of Patent: Feb. 4, 2014

(54) ELECTRICAL CONNECTING APPARATUS

(75) Inventors: Ken Hasegawa, Aomori (JP); Hisao Narita, Aomori (JP); Yutaka Funamizu, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 307 days.

(21) Appl. No.: 12/708,922

(22) Filed: Feb. 19, 2010

(65) Prior Publication Data

US 2010/0210122 A1    Aug. 19, 2010

(30) Foreign Application Priority Data

Feb. 19, 2009   (JP) .................................. 2009-036435

(51) Int. Cl.
*G01R 31/308* (2006.01)
*G01R 31/00* (2006.01)
*G01R 31/20* (2006.01)

(52) U.S. Cl.
USPC ............ 324/750.23; 324/750.16; 324/754.07

(58) Field of Classification Search
None
See application file for complete search history.

(56) References Cited

U.S. PATENT DOCUMENTS

| | | | | |
|---|---|---|---|---|
| 4,811,002 A | * | 3/1989 | Otsubo | ......................... 340/687 |
| 5,847,468 A | * | 12/1998 | Nomura et al. | ................ 257/797 |
| 5,971,276 A | * | 10/1999 | Sano et al. | ................ 235/462.01 |
| 6,118,516 A | * | 9/2000 | Irie et al. | .......................... 355/53 |
| 7,826,041 B2 | * | 11/2010 | Takeda | ............................. 356/71 |
| 7,934,944 B2 | * | 5/2011 | Hamada et al. | .......... 324/763.01 |
| 7,934,945 B2 | * | 5/2011 | Narita et al. | ............. 324/755.04 |
| 2008/0143362 A1 | * | 6/2008 | Narita et al. | ................... 324/754 |
| 2010/0105224 A1 | * | 4/2010 | Narita et al. | ................... 324/754 |
| 2010/0194416 A1 | * | 8/2010 | Hoshi et al. | ..................... 324/755 |

FOREIGN PATENT DOCUMENTS

| | | | | |
|---|---|---|---|---|
| JP | 10-206463 | | 8/1998 | |
| JP | 2011-026521 | | 1/1999 | |
| JP | 2005-201844 | | 7/2005 | |
| JP | 2005-533263 | | 11/2005 | |
| JP | 2007-278859 | | 10/2007 | |
| JP | 2008-145238 | | 6/2008 | |
| JP | 2008-175762 | | 7/2008 | |
| JP | 2010192741 A | * | 9/2010 | ............. G01R 31/28 |
| WO | 2004/015432 | | 2/2004 | |
| WO | 2004/072661 | | 8/2004 | |

\* cited by examiner

*Primary Examiner* — Jermele M Hollington
(74) *Attorney, Agent, or Firm* — Graybeal Jackson LLP

(57) ABSTRACT

An embodiment of an electrical connecting apparatus enables reliable identification of a mark and enables accurate and easy determination of a coordinate position of the mark. The electrical connecting apparatus comprises a supporting body having a lower surface, a plurality of contacts arranged on the lower surface of the supporting body, a mark that is provided on a lower side of the supporting body and whose light passing feature differs from that of an area adjacent to the mark, and a light source provided to the supporting body to irradiate light to the mark from an upper side of the mark.

15 Claims, 12 Drawing Sheets

Fig. 10
(A) 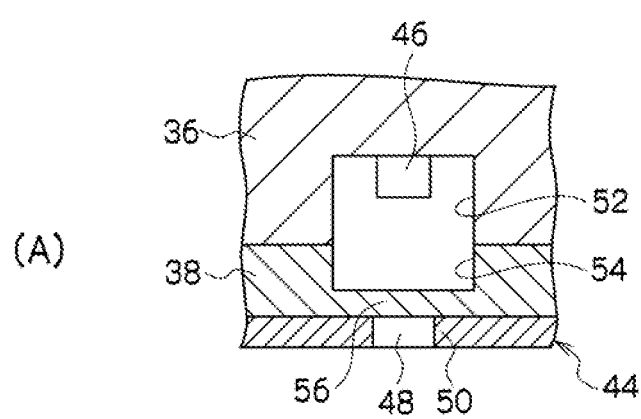
(B) 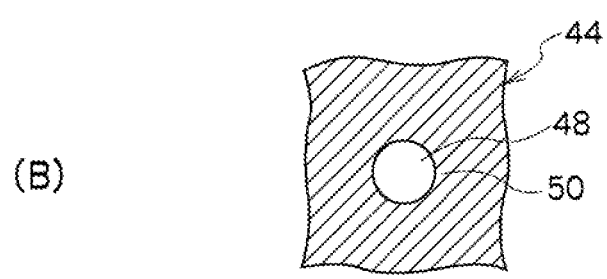

ELECTRICAL CONNECTING APPARATUS

PRIORITY CLAIM

The instant application claims priority to Japanese Patent Application No. 2009-036435, filed Feb. 19, 2009, which application is incorporated herein by reference in its entirety.

TECHNICAL FIELD

An embodiment of the subject matter relates to an electrical connecting apparatus for use in an electrical test of a flat-plate-shaped device under test such as an integrated circuit.

BACKGROUND

A flat-plate-shaped device under test such as an integrated circuit formed on a semiconductor wafer, an integrated circuit diced from a wafer, or the like, undergoes an electrical test with use of an electrical connecting apparatus such as a probe card to determine whether or not the integrated circuit functions in accordance with the specification. At the time of such an electrical test, the device under test is thrust at its electrodes by probe tips of contacts of the electrical connecting apparatus and is supplied with electrical signals in this state. This is shown generally in Japanese National Patent Appln. Public Disclosure No. 2008-145238 and Japanese National Patent Appln. Public Disclosure No. H10-206463, which are incorporated by reference.

In a testing apparatus using the electrical connecting apparatus of this kind, it is important that the probe tip of each contact is opposed to the corresponding electrode of the device under test and that a virtual plane formed by the probe tips of the plural contacts is parallel to a test stage in order to obtain accurate test results.

Accordingly, the testing apparatus has an alignment function of detecting coordinate positions of plural marks such as alignment marks provided on the electrical connecting apparatus by a detecting unit provided on the test stage receiving the device under test to determine the two-dimensional coordinate position or three-dimensional coordinate position of each mark and relatively displacing the electrical connecting apparatus and the test stage based on the determined result to align the probe tip of each contact with the corresponding electrode of the device under test.

The electrical connecting apparatus used in the testing apparatus having the above alignment function is exemplified by one that uses the probe tip itself of the contact as a mark (Japanese National Patent Appln. Public Disclosure No. 2008-175762, which is incorporated by reference), one in which a mark is formed in proximity to the probe tip (Japanese National Patent Appln. Public Disclosure No. 2005-533263 (WO2004-15432), which is incorporated by reference), and one in which a mark is provided at a member other than the contact (Japanese National Patent Appln. Public Disclosure No. 2007-278859, which is incorporated by reference).

In any of the above testing apparatuses, light is irradiated from the detecting unit toward the mark, and the reflected light from the mark is detected at the detecting unit to identify the mark and determine the coordinate position of the mark.

However, in the above conventional apparatuses, since the output signal of the detecting unit is inevitably influenced to a great extent by the incident light to the detecting unit reflected from the surrounding area of the mark although the amount of the reflected light from the mark is small, the mark cannot be identified accurately, and thus it is difficult to determine an accurate coordinate position of the mark.

SUMMARY

An embodiment of an electrical connecting apparatus is provided which enables reliable identification of a mark and enable accurate and easy determination of a coordinate position of the mark.

An electrical connecting apparatus according to an embodiment comprises a supporting body having a lower surface, a plurality of contacts arranged on the lower surface of the supporting body, a mark that is provided at a lower portion or a lower side of the supporting body and whose light passing feature differs from that of an area adjacent to the mark, and a light source provided to the supporting body to irradiate light to the mark from an upper side of the mark.

The supporting body may have a recess opened toward the mark, and the light source may be arranged in the recess.

The supporting body may include a ceramic board and a sheet-like board having a lower surface on which the contacts are arranged and arranged to be piled on a lower surface of the ceramic board. In this case, the mark may be provided on the lower surface of the sheet-like board, and the ceramic board may have the recess.

The supporting body may include a wiring board, a block having a lower surface projecting downward from the wiring board and supported on the wiring board, and a sheet-like board having a lower surface on which the contacts are supported and arranged on a lower side of the wiring board and the block in a state where an upper surface of an area at which the contacts are arranged is opposed to the lower surface of the block. In this case, the mark may be provided on the lower surface of the sheet-like board, and the block may have the recess.

The supporting body may include a wiring board having a lower surface on which the contacts are supported, a probe holder arranged on a lower surface of the wiring board, and an adhesive layer attaching the contacts to the probe holder so as to support the contacts on the lower surface of the wiring board. In this case, the mark may be provided on the lower surface of the wiring board, and the wiring board may have the recess.

The supporting body may include a wiring board having a lower surface on which the contacts are supported, a probe holder arranged on a lower surface of the wiring board, and an adhesive layer attaching the contacts to the probe holder so as to support the contacts on the lower surface of the wiring board. In this case, the mark may be provided on the probe holder or the adhesive layer, and the probe holder or the adhesive layer provided with the mark may have the recess.

The sheet-like board may have a second recess opened toward the recess of the ceramic board. Also, the mark may be a sheet-like mark member arranged on the lower surface of the sheet-like board, and the mark may be formed in the mark member in a state of being opposed to the second recess.

The mark may be formed in the sheet-like board in a state of being opposed to the recess of the ceramic board.

The mark may include an area that permits passing of light from the light source, and the adjacent area may restrict or block passing of light from the light source. On the contrary, the mark may include an area that restricts or blocks passing of light from the light source, and the adjacent area may permit passing of light from the light source.

The mark may be located at a position in proximity to the contacts at which the contacts are not located. Also, the mark may be formed in a sheet-like mark member arranged on the lower surface of the supporting body.

Light from a light source may be irradiated to a mark provided on the lower side of a supporting body supporting contacts from the upper side of the mark. As for the amount of consequent incident light to a detecting unit provided on the side of a test stage, large difference exists between the amount of light from the mark and the amount of light from an area adjacent to the mark. As a result, since sufficient light-dark contrast can be obtained between the mark and the surrounding area, the mark can be identified reliably, and the coordinate position of the mark can be determined accurately and readily.

When the mark and the adjacent area are formed in a sheet-like board itself or in a mark member arranged on the lower surface of the sheet-like board, the mark and the adjacent area may be manufactured together with the sheet-like board. Thus, the mark and the adjacent area may be manufactured readily.

BRIEF DESCRIPTION OF THE DRAWINGS

FIG. 10 is a vertical cross-sectional view showing a third embodiment of the mark and its surrounding.

DETAILED DESCRIPTION

Figure 1:
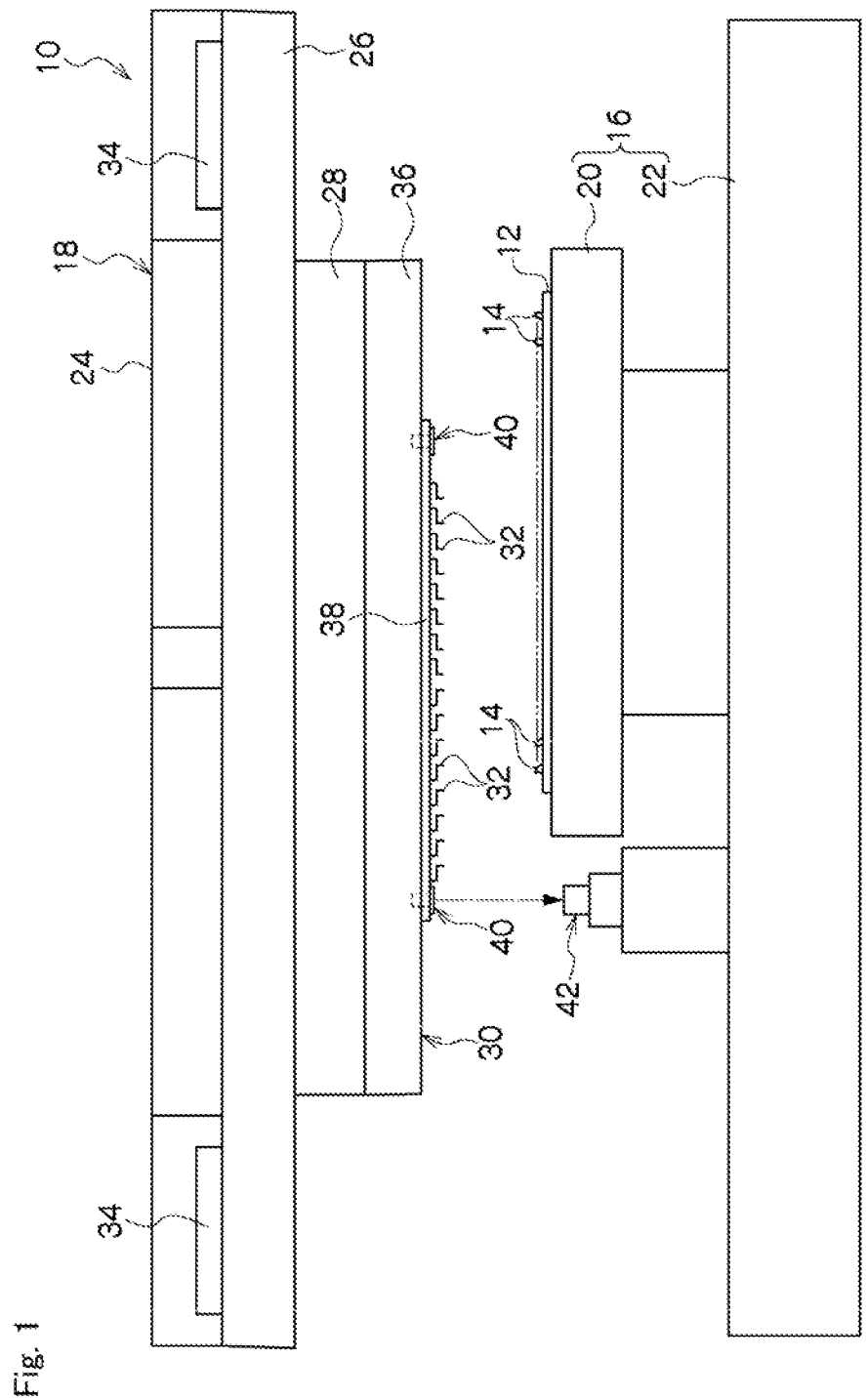
FIG. 1 is a front view showing an embodiment of a testing apparatus having an electrical connecting apparatus.

In FIG. 1, a right-left direction is referred to as a right-left direction or an X direction, a direction perpendicular to the drawing sheet is referred to as a front-back direction or a Y direction, and an up-down direction is referred to as an up-down direction or a Z direction. However, these directions differ with the posture in which a device under test is arranged in a testing apparatus.

Accordingly, as for the above directions, the X direction or the Y direction may be determined to be within any one plane of a horizontal plane, an inclined surface inclined to the horizontal plane, and a vertical plane vertical to the horizontal plane or may be determined to be a combination of these planes in accordance with an actual testing apparatus.

Referring to FIG. 1, an embodiment of a testing apparatus 10 is used in an electrical test to determine whether or not a plurality of semiconductor devices such as integrated circuits formed on a disk-shaped semiconductor wafer 12 are manufactured in accordance with the specification, with the disk-shaped semiconductor wafer 12 as a device under test. These semiconductor devices are tested or inspected at a time or in several batches. Each semiconductor device has a plurality of electrodes 14 such as pad electrodes on the upper surface.

Figure 2:
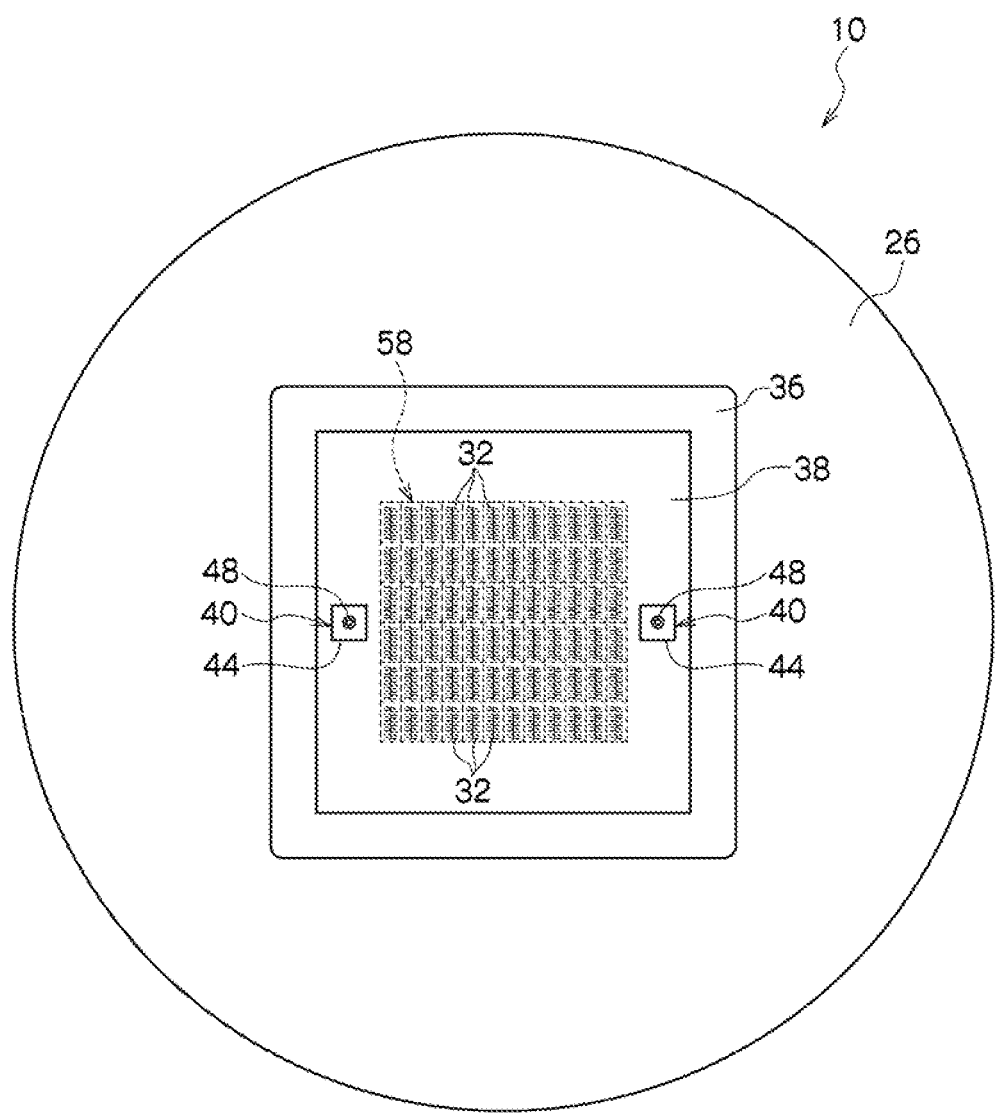
FIG. 2 is a bottom view of the electrical connecting apparatus shown in FIG. 1.

Referring to FIGS. 1 and 2, the testing apparatus 10 has a test stage 16 receiving the wafer 12 and an electrical connecting apparatus 18 connecting the integrated circuits of the wafer 12 received on the test stage 16 to a not shown electrical circuit of the testing apparatus 10.

The test stage 16 has a chuck top 20 receiving the wafer 12 on the upper surface and releasably vacuum-absorbs it and an actuating mechanism 22 three-dimensionally moving the chuck top 20 in the X, Y, and Z directions and angularly rotating it around a theta axis extending in the Z direction.

FIGS. 1 and 2 show an embodiment of the electrical connecting apparatus 18 resulting from improvement of a connecting apparatus described in Japanese National Patent Appln. Public Disclosure No. 2008-145238, which is incorporated by reference so that the embodiment may be applied to the connecting apparatus.

The electrical connecting apparatus 18 includes a reinforcing member 24 having a flat lower surface, a circular flat-plate-shaped wiring board 26 held on the lower surface of the reinforcing member 24, a rectangular flat-plate-shaped electrical connector 28 arranged on the lower surface of the wiring board 26, a rectangular flat-plate-shaped probe board 30 arranged on the lower surface of the electrical connector 28, and a plurality of contacts 32 arranged on the lower surface of the probe board 30, as described in Japanese National Patent Appln. Public Disclosure No. 2008-145238.

The reinforcing member 24 is made of a metal material such as a stainless steel plate so as to be formed in a plate-like flat shape.

As described in Japanese National Patent Appln. Public Disclosure No. 2008-145238, an annular thermal deformation restricting member (not shown) restricting thermal deformation of the reinforcing member 24 may be arranged on the upper side of the reinforcing member 24, and a cover (not shown) may be arranged on the thermal deformation restricting member.

The wiring board 26 is made of an electrical insulating resin such as a glass-containing epoxy resin in a disk shape, has a plurality of internal wires (not shown) for use in transmission/reception of signals to/from the corresponding contacts 32, and has multiple connectors (or multiple tester lands) 34 to be connected to an electrical circuit (not shown) of the testing apparatus 10 at the annular circumferential portion on the upper surface of the board 26.

The reinforcing member 24 and the wiring board 26 are coaxially coupled by a plurality of screw members (not shown) in a state where the lower surface of the reinforcing member 24 and the upper surface of the wiring board 26 abut on each other.

The electrical connector 28 has connecting members electrically connecting the aforementioned internal wires of the wiring board 26 to internal wires (not shown) of the probe board 30.

The electrical connector 28 is coupled with the center portion on the lower surface of the wiring board 26 together with the probe board 30 by an appropriate attachment (not shown) and a plurality of screw members (not shown) in a state where its upper surface abuts on the lower surface of the wiring board 26 and where the probe board 30 is piled on the lower side of the electrical connector 28, in the example shown in the figures.

The probe board 30 is a combined board in which a multilayered ceramic board 36 and a multilayered flexible board or sheet-like board 38 are layered one above the other and is coupled with the lower surface of the wiring board 26 together with the electrical connector 28 as described above in a state where the ceramic board 36 is on the upper side and where the sheet-like board 38 is on the lower side, in the example shown in the figures.

The ceramic board 36 is formed in a rectangular flat shape to be approximately as large as the electrical connector 28 and has a plurality of internal wires (not shown) electrically connected to the internal wires of the wiring board by the aforementioned connecting members of the electrical connector 28.

The sheet-like board 38 is formed in a rectangular flat shape to be slightly smaller than the ceramic board 36 and is made of an electrical insulating resin such as a polyimide resin to be formed integrally with the ceramic board 36.

The sheet-like board 38 has inside a plurality of internal wires (not shown) electrically connected to the internal wires of the ceramic board 36 and has on its lower surface a plurality of probe lands (not shown) electrically connected to the internal wires of the sheet-like board 38.

Each contact 32 is connected to the probe land by means of connection by a conductive bonding material such as solder, welding by laser, or the like, and is attached to the probe land in a cantilevered manner in a state where the probe tip is directed downward. Accordingly, in the example shown in the figures, the probe board 30 acts as a supporting body supporting the contacts 32.

In the example shown in the figures, a plate-shaped probe formed in a crank shape is used as each contact 32, and its lower end on the tip end side acts as a probe tip. Such a contact 32 is publicly known, and an example of it is described in Japanese National Patent Appln. Public Disclosure No. 2005-201844, which is incorporated by reference.

However, each contact 32 may be one conventionally well known such as a probe made of a metal fine wire such as a tungsten wire, a plate-shaped probe manufactured with use of a photolithographic technique and a deposition technique, a probe in which plural wires are formed on one surface of an electrical insulating sheet such as polyimide to use a part of these wires as a contact, or the like.

In either case, the probe tips of the contacts 32 are arrayed on a virtual plane parallel to the wafer 12 received on the chuck top 20.

The testing apparatus 10 also includes an alignment apparatus for use in alignment of the probe tip of each contact 32 with the corresponding electrode 14 of the wafer 12. Such an alignment apparatus includes a plurality of mark units 40 provided on the side of the connecting apparatus 18 and a detecting unit 42 provided on the side of the test stage 16 to capture the mark units 40.

Each mark unit 40 includes a rectangular sheet-like mark member 44 arranged on the lower surface of the sheet-like board 38 and a light source 46 arranged above the mark member 44, as shown in FIGS. 3(A) and 3(B).

The mark member 44 is made of a material that blocks passing of light from the light source 46, in which a circular area at the center is an alignment mark 48 that blocks passing of light from the light source 46, and in which an annular area around the mark 48 is an area 50 that permits passing of light from the light source 46. In FIG. 3(B), areas that block passing of light from the light source 46 are shaded.

For each light source 46 may be used an appropriate light source such as one that generates light with a specific wavelength such as a light emitting diode or a laser oscillator, one that generates white light such as a white lamp, or the like.

In either case, each light source 46 receives electricity from a not shown power source via the wiring board 26, the electrical connector 28, and the probe board 30 and emits light. Thus, the wiring board 26, the electrical connector 28, and the probe board 30 have conductive paths for electricity to the light source 46.

The mark 48 has the same light blocking feature as a light blocking feature showing a light passing feature of the material itself of the mark member 44 and is formed in a circular flat shape. In contrast, the area 50 is an annular through hole penetrating the mark member 44 in its thickness direction.

However, in a case where the mark 48 is an area that completely blocks passing of light, the area 50 may be either a transparent area that permits complete passing of light or a semi-transparent area that permits partial passing of light. On the contrary, in a case where the mark 48 is a semi-transparent area that permits partial passing of light, the area 50 shall be a transparent area that permits complete passing of light.

In other words, the mark 48 and the area 50 have only to have optical features that can be distinguished from each other clearly. Thus, the mark 48 and the area 50 may be areas that permit passing of optical elements with different wavelengths. For example, either the mark 48 or the area 50 may be an area that exclusively permits passing of red light while the other one may be an area that exclusively permits passing of purple light.

The ceramic board 36 has a recess 52 opened downward to be opposed to the mark 48 and the area 50. The light source 46 is arranged in the recess 52 so as to irradiate the mark 48 and the area 50 with light from above. As the light source 46, a light source appropriate for light passing features of the mark 48 and the area 50 is selected such as one that generates monochromatic light, one that generates white light, or the like.

The sheet-like board 38 has a recess 54 corresponding to the recess 52 and opened to the side of the recess 52. This recess 54 makes a part 56 of the sheet-like board 38 opposed to the mark 48 and the area 50 smaller in thickness and makes the part 56 a transparent or semi-transparent light passing area in accordance with the light source 46, the mark 48, and the area 50.

The detecting unit 42 includes a camera, e.g., a CCD camera, such as an area sensor that captures the mark 48 and the surroundings. It is arranged on the actuating mechanism 22, is three-dimensionally moved in the X, Y, and Z directions together with the chuck top 20, and is angularly rotated around a theta axis extending in the Z direction. The detecting unit 42 may be arranged on the chuck top 20.

The output signal of the detecting unit 42 is supplied to the electrical circuit of the testing apparatus 10, which identifies the mark 48, and is used to determine a coordinate position of the mark 48 against the test stage 16 (that is, coordinate positions of the probe tips of the contacts 32 against the electrodes 14 of the wafer 12) and generate an instruction signal that displaces the chuck top 20 against the connecting apparatus 18 based on the determined coordinate position.

Alignment by the testing apparatus 10 is performed in the following manner.

First, the chuck top 20 and the detecting unit 42 are two-dimensionally or three-dimensionally moved relative to the connecting apparatus 18 to a position where the detecting unit 42 may capture a mark 48 and the area 50 and stopped at the position.

Next, in the above state, the mark 48 and the area 50 around it are captured by a camera of the detecting unit 42, and an output signal of the camera is supplied to the not shown electrical circuit as described above. At this moment, the light source 46 is illuminated, and the mark 48 and the surrounding area are irradiated with light from the light source 46 from their upper side.

As for the amount of incident light on the detecting unit 42, large difference exists between the amount of light from the mark 48 and the amount of light from the area 50 since the mark 48 restricts or blocks passing of light while the area 50 permits passing of light.

The aforementioned movement of the detecting unit 42 relative to the connecting apparatus 18 and capture of the mark 48 and the area 50 by the detecting unit 42 are performed per mark 48 as a mark detecting step.

The aforementioned electrical circuit identifies the mark 48 based on the input signal and performs a coordinate position determining step of determining a coordinate position of the mark 48 against the test stage 16 (that is, coordinate positions of the probe tips of the contacts 32 against the electrodes 14 of the wafer 12) per mark 48.

When the above coordinate position determining step for every mark 48 is finished, the aforementioned electrical circuit generates an instruction signal that displaces the chuck top 20 against the connecting apparatus 18 based on the determined coordinate positions and supplies the instruction signal to a not shown actuating circuit. This actuates the actuating mechanism 22 and moves the chuck top 20 against the connecting apparatus 18, thereby locating the probe tip of each contact 32 above the corresponding electrode 14.

According to the testing apparatus 10, sufficient light-dark contrast can be obtained between the mark 48 and the surrounding area 50. As a result, the mark 48 may be identified reliably, and the coordinate position of the mark 48 can be determined accurately and readily.

Also, the mark member 44 can be manufactured readily since it can be manufactured together with the sheet-like board 38 with use of a photolithographic technique, a plating technique, an electroforming technique, or the like, in a similar manner to that of the sheet-like board 38.

Figure 3:
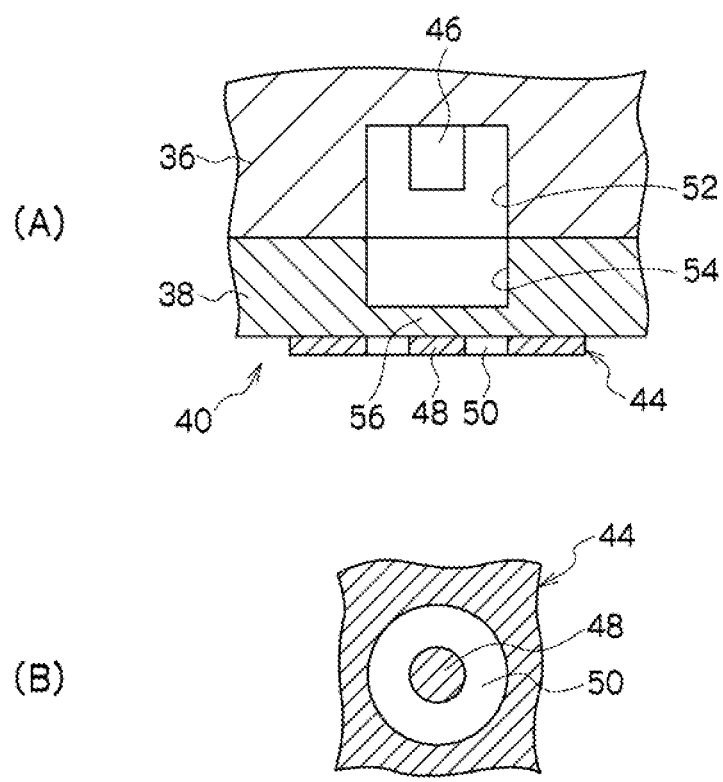
FIG. 3(A) is a vertical cross-sectional view showing a first embodiment of a mark and its surrounding.
FIG. 3(B) is a bottom view.

In a case of the connecting apparatus having the sheet-like board 38 as a part of a supporting body, the pattern corresponding to the mark 48 and the area 50 of the mark member 44 may be formed at the part 56 of the sheet-like board 38 in FIG. 3. By doing so, the mark member 44 may be manufactured more readily.

Figure 4:
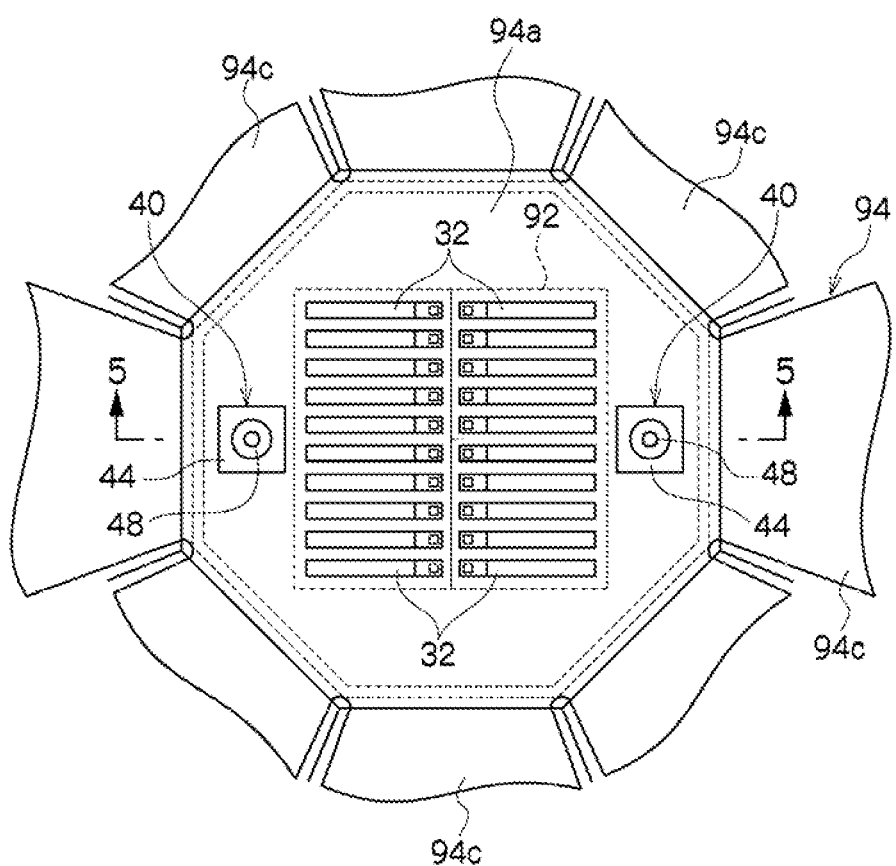
FIG. 4 is a bottom view showing a second embodiment of the electrical connecting apparatus.
Figure 5:
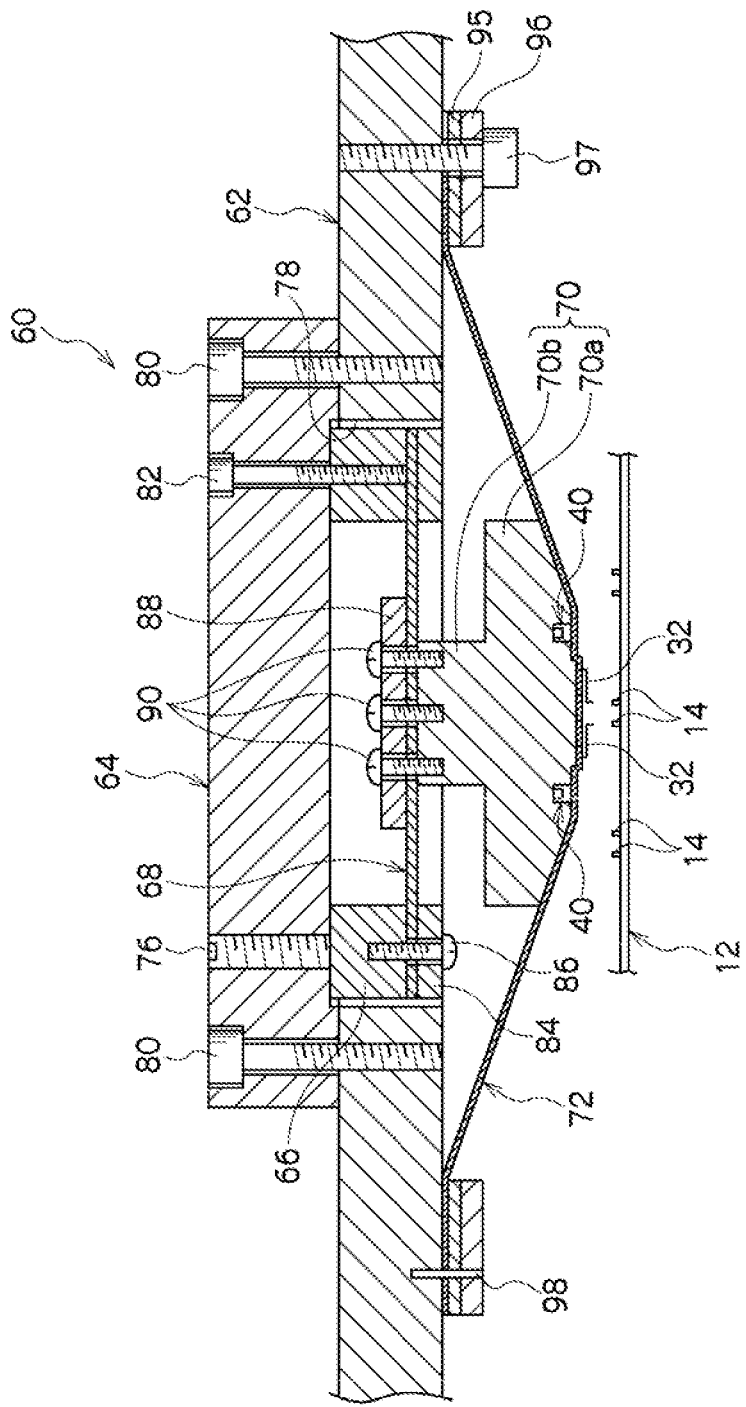
FIG. 5 is a cross-sectional view obtained along the line 5-5 in FIG. 4.

FIGS. 4 and 5 show an embodiment of an electrical connecting apparatus 60 resulting from improvement of a connecting apparatus described in Japanese National Patent Appln. Public Disclosure No. 2007-278859, which is incorporated by reference so that the embodiment may be applied to the connecting apparatus. The connecting apparatus 60 is used in an electrical test of a plurality of semiconductor devices formed on the semiconductor wafer 12, with the wafer 12 as a device under test, in a similar manner to that of the aforementioned connecting apparatus 10.

Each semiconductor device arranges on its upper surface two rows of the plurality of electrodes 14 spaced in the right-left direction in the example shown in the figures. A testing apparatus using the connecting apparatus 60 tests these semiconductor devices at a time or in several batches. As for a test stage to be used in the testing apparatus together with the connecting apparatus 60, the test stage 16 shown in FIG. 1 may be used.

The connecting apparatus 60 includes a disk-shaped wiring board 62, a plate-shaped member 64 attached to the upper surface of the wiring board 62, a plate-shaped ring-like member 66 arranged on the lower side of the plate-shaped member 64, a leaf spring 68 arranged on the lower side of the ring-like member 66, a block 70 mounted on the lower surface of the leaf spring 68, a circuit board or a sheet-like board 72 arranged on the lower side of the block 70, and a plurality of adjusting screws 76 penetrating the plate-shaped member 64 in its thickness direction to abut on the ring-like member 66, as described in Japanese National Patent Appln. Public Disclosure No. 2007-278859.

The wiring board 62 has a through hole 78 passing through its center portion in the thickness direction (up-down direction), not shown multiple connectors (or multiple tester lands) to be connected to a not shown electrical circuit of the testing apparatus at the circumferential portion on the upper surface, and a plurality of connection lands (not shown) on the lower surface at an area between the through hole 78 and the outer circumferential edge to be spaced in the circumferential direction. The through hole 78 is formed in a circular flat shape.

The wiring board 62 also has a plurality of internal wires (not shown) each connecting the terminal of the connector (not shown) to the connection land (not shown) in one-to-one relationship. Such a wiring board 62 can be made of a glass-containing epoxy resin or a ceramic material as in a similar manner to that of the aforementioned wiring board 26.

The plate-shaped member 64 is formed in a circular plate shape to be larger than the through hole 87 and is attached to the upper surface of the wiring board 62 in a state of closing the through hole 78, that is, to be parallel to the wiring board 62, by a plurality of screw members 80 penetrating the plate-shaped member 64 and screwed in the wiring board 62.

Also, the plate-shaped member 64 is made of a metal material such as stainless steel so as to function as a reinforcing plate of the wiring board 62. Accordingly, the plate-shaped member 64 does not need to be a complete plate.

The ring-like member 66 is made of a metal material such as stainless steel, especially a metal material with a small thermal expansion coefficient, to be formed in a plate-like ring shape having a slightly smaller outer diameter than the diameter of the through hole 78 and is located within the through hole of the wiring board 62.

Also, the ring-like member 66 is attached to the lower surface of the plate-shaped member 64 to be parallel to the wiring board 62 and the plate-shaped member 64 by a plurality of attachment screws 82 penetrating the plate-shaped member 64 in its thickness direction and screwed in the ring-like member 66.

The leaf spring 68 has a flat central area, a plurality of plate-like extending areas spaced in the circumferential direction of a virtual circle and extending from the central area in the radial direction of the virtual circle, and a ring-like circumferential area integrally continuing around the extending areas.

The central area and the plate-like extending areas of the leaf spring 68 are formed like an asterisk (*) shape. The number of the extending areas may be an arbitrary value such as four, six, eight, or the like. The leaf spring 68 may be made of a material selected from a group consisting of tungsten, molybdenum, an alloy of these, and a ceramic material having a smaller thermal expansion coefficient than that of stainless steel.

The leaf spring 68 is attached to the lower surface of the ring-like member 66 at the circumferential area to be parallel to the wiring board 62 by a ring-like spring holder 84 and a plurality of screw members 86 passing through the spring holder 84 from the lower side and screwed in the ring-like member 66.

In the example shown in the figures, the spring holder 84 is formed by a ring-like single member. However, the spring holder 84 may be formed by a plurality of holder members combined so as to form a similar ring at the circumferential area of the leaf spring 68.

The block 70 comprises a lower block portion 70a having a truncated polygonal pyramidal downward surface and a prismatic upper block portion 70b that is formed integrally with the lower block portion 70a and whose upper end surface is an attached surface to the leaf spring 68.

In the example shown in the figures, the aforementioned downward surface of the lower block portion 70a is formed by a downward attachment surface to which the sheet-like board 72 is to be attached, a downward intermediate surface continuing into the perimeter of the attachment surface, and a plurality of obliquely downward slopes continuing into the perimeter of the intermediate surface. Also, the attachment surface, the intermediate surface, and the attached surface are parallel surfaces.

The block 70 is attached to the lower surface of the central area of the leaf spring 68 at the upper block portion 70b by a plurality of screw members 90 in a state where the aforementioned central area of the leaf spring 68 is sandwiched between an attachment plate 88 and the upper block portion 70b and in a state where the lower block portion 70a is protruded in the downward direction of the wiring board 62.

The sheet-like board 72 has a plurality of strip-shaped internal wires (not shown) inside an electrical insulating sheet such as polyimide. Thus, the sheet-like board 72 has flexibility.

The sheet-like board 72 has a rectangular contact area 92 at which the contacts 32 are arranged and an outside area 94 around the contact area 92. The outside area 94 comprises an intermediate area 94a integrally continuing into the perimeter of the contact area 92 and a plurality of extending portions 94c extending from the intermediate area 94a in the radial direction of a virtual circle centering around the contact area 92 to be spaced around the intermediate area 94a.

The sheet-like board 72 is attached at the outside edge portions of its extending portions 94c to the lower surface of the wiring board 62 by an elastic plate-shaped rubber ring 95 such as a silicon rubber, a plate-shaped thrusting ring 96 having certain hardness such as stainless steel, and a plurality of screw members 97. Each screw member 97 penetrates the thrusting ring 96, the rubber ring 96, and the extending portion 94c and is screwed in the wiring board 62.

Positioning of the sheet-like board 72 against the wiring board 62 is performed by a plurality of positioning pins 98 extending downward from the wiring board 62 and penetrating the extending portions 94c of the sheet-like board 72, the rubber ring 95, and the thrusting ring 96 from the upper side to the lower side. Each positioning pin 98 is held in the wiring board 62 in a stable manner.

Each internal wire of the sheet-like board 72 extends outward in the radial direction of the aforementioned virtual circle in the outside area 94 from the inside of the contact area 92 at which the contacts 32 are arranged.

The outside edge portion of each internal wire of the sheet-like board 72 is exposed on the upper surface of the sheet-like board 72 and is electrically connected to the aforementioned connection land provided at the circumferential portion on the lower surface of the wiring board 62. On the other hand, the edge portion of each internal wire of the sheet-like board 72 on the side of the contact area 92 is exposed on the lower surface of the sheet-like board 72 and acts as a probe land.

Each contact 32 is mounted on the aforementioned probe land in a cantilevered manner. Thus, in the second embodiment of the electrical connecting apparatus, the block 70 and the sheet-like board 72 function as supporting bodies supporting the contacts 32.

In the second embodiment of the electrical connecting apparatus as well, the probe tips of the contacts 32 are arrayed on a virtual plane parallel to the wafer 12 received on the chuck top 20.

The connecting apparatus 60 also includes an alignment apparatus for alignment of the probe tip of each contact 32 with the corresponding electrode 14 of the wafer 12. Such an alignment apparatus includes a plurality of mark units 40 shown in FIG. 3 provided on the side of the connecting apparatus 60 and a detecting unit 42 provided on the side of the test stage 16 shown in FIG. 1 to capture the mark units 40, as in a similar manner to that of the connecting apparatus 10 shown in FIGS. 1 and 2.

Each mark unit 40 may be the same unit as the mark unit 40 shown in FIGS. 3(A) and 3(B). Accordingly, the detailed explanation is omitted. Each light source 46 receives electricity from a not shown power source via the wiring board 62, the sheet-like board 72, and the block 70 and emits light. Thus, the wiring board 62 and the sheet-like board 72 have conductive paths for electricity to the light source 46.

Alignment with use of the mark units 40 and the detecting unit 42 shown in FIG. 1 is performed in a similar manner to that of alignment by the testing apparatus 10. Accordingly, the detailed explanation is omitted.

Figure 6:
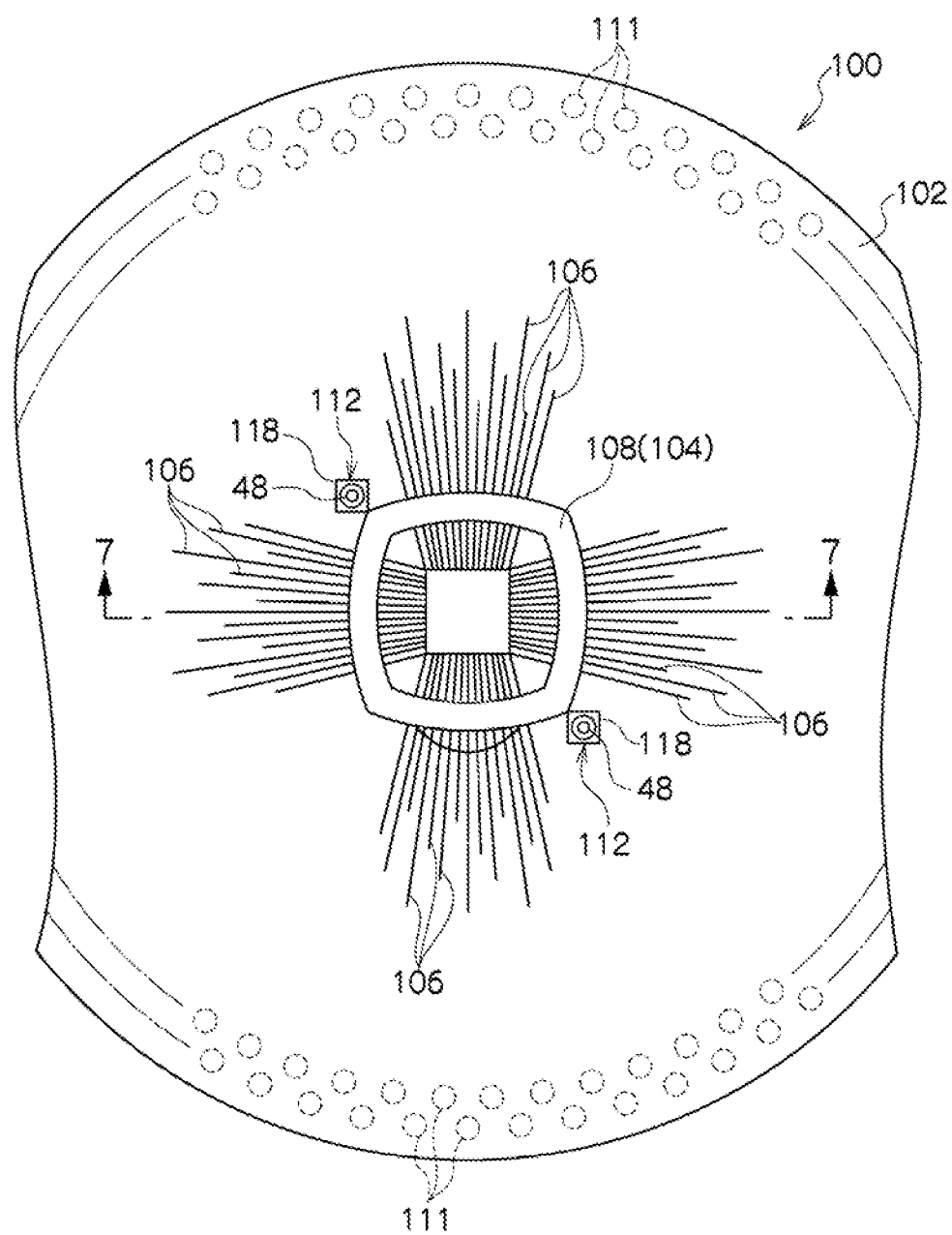
FIG. 6 is a bottom view showing a third embodiment of the electrical connecting apparatus.
Figure 7:
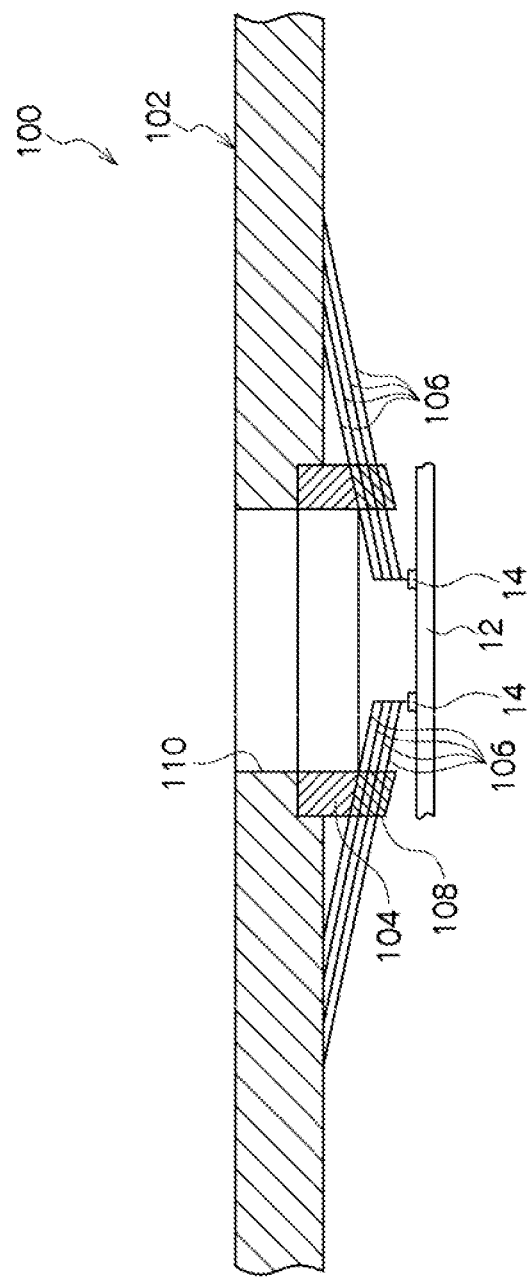
FIG. 7 is a cross-sectional view obtained along the line 7-7 in FIG. 6.

FIGS. 6 and 7 show an embodiment of an electrical connecting apparatus 100 resulting from improvement of a connecting apparatus described in Japanese National Patent Appln. Public Disclosure No. H10-206463, which is incorporated by reference so that the embodiment may be applied to the connecting apparatus. The connecting apparatus 100 is used in an electrical test of a plurality of semiconductor devices formed on the semiconductor wafer 12, with the wafer 12 as a device under test, as in a similar manner to those of the aforementioned connecting apparatuses 10 and 60.

Each semiconductor device arranges on the upper surface of each part corresponding to a side of a virtual rectangle a row of the plurality of electrodes 14 in the example shown in the figures. A testing apparatus using the connecting apparatus 100 tests these semiconductor devices at a time or in several batches. As for a test stage to be used in the testing apparatus together with the connecting apparatus 100, the test stage 16 shown in FIG. 1 may be used.

The connecting apparatus 100 includes a wiring board 102 made of an electrical insulating material, a probe holder 104 formed in an approximately rectangular flat shape arranged on the lower side of the central area of the wiring board 102, plural kinds (four kinds in the example shown in the figures) of L-shaped contacts 106 arranged in plural layers on the lower surface of the probe holder 104, and an adhesive layer 108 bonding the contacts 106 on the lower surface of the probe holder 104, as described in Japanese National Patent Appln. Public Disclosure No. H10-206463.

As for each contact 106, a probe tip portion on the tip end side of a metal fine wire such as tungsten is bent downward from the remaining probe main body portion, and a tip end of the probe tip portion is regarded as a probe tip to be thrust to the electrode 14 of the device under test. Four kinds of these contacts 106 are formed in the same shapes and structures except that the length dimensions of the probe tip portions are different from one another.

In the example shown in the figures, four kinds of these contacts 106 are arranged in four layers, and the contacts whose probe tip portions have the same length dimensions are arranged in the same layer. The length dimension of the probe tip portion is smaller in order of contacts 106 located in the first layer (lowermost layer), second layer, third layer, and fourth layer (uppermost layer).

The wiring board 102 is a board formed in a disk-like shape made of an electrical insulating material such as a glass-containing epoxy resin or a polyimide resin and has at the center portion an opening 110 penetrating the wiring board 102 in its thickness direction.

The opening 110 is formed in an approximately rectangular flat shape that is approximately as large as the inner surface of the probe holder 104. The wiring board 102 also has multiple tester lands (or multiple connectors) 111 to be electrically connected to a tester at the outer circumferential portion on the upper surface.

The probe holder 104 is formed in a cylindrical shape having an approximately rectangular flat shape and is attached at its upper end to the lower surface of the wiring board 102 by a plurality of screw members or by adhesive in a state of projecting downward from its lower surface so as to be located around the opening 110.

In the third embodiment of the electrical connecting apparatus as well, the probe tips of the contacts 106 are arrayed on a virtual plane parallel to the wafer 12 received on the chuck top 20.

The connecting apparatus 100 also includes an alignment apparatus for alignment of the probe tip of each contact 106 with the corresponding electrode 14 of the wafer 12. Such an alignment apparatus includes a plurality of mark units 112 provided on the side of the connecting apparatus 100 and a detecting unit 42 provided on the side of the test stage 16 shown in FIG. 1 to capture the mark units 112.

Figure 8:
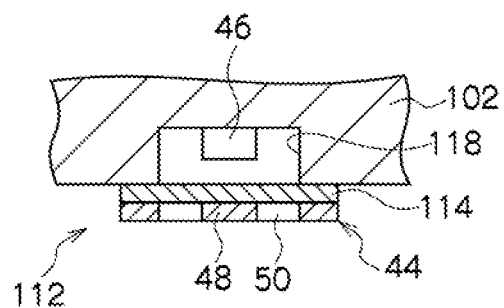
FIG. 8 is a vertical cross-sectional view showing a second embodiment of the mark and its surrounding.

Each mark unit 112 includes a rectangular transparent sheet 114 arranged on the lower surface of the wiring board 102, a rectangular sheet-like mark member 44 arranged on the lower surface of the transparent sheet 114, and the aforementioned light source 46 arranged above the mark member 44, as shown in FIG. 8.

The mark member 44 is the same as the mark member 44 shown in FIGS. 3(A) and 3(B). Accordingly, the mark member 44 is made of a material that restricts or blocks passing of light from the light source 46, in which the center is an alignment mark 48 that restricts or blocks passing of light from the light source 46, and in which an area around the mark 48 is an area 50 that permits passing of light from the light source 46.

Each light source 46 is the same as the light source 46 shown in FIGS. 3(A) and 3(B). The wiring board 102 has a recess 118 opened downward to be opposed to the mark 48 and the area 50. The light source 46 is arranged in the recess 118 so as to irradiate the mark 48 and the area 50 with light from above.

In the third embodiment of the electrical connecting apparatus, each light source 46 receives electricity from a not shown power source via the wiring board 102 and emits light. Thus, the wiring board 102 has a conductive path for electricity to the light source 46 and functions as a supporting body supporting the contacts 106 together with the probe holder 104 and the adhesive layer 108.

Alignment with use of the mark units 112 and the detecting unit 42 shown in FIG. 1 is performed in a similar manner to that of alignment by the testing apparatus 10. Accordingly, the detailed explanation is omitted.

Figure 9:
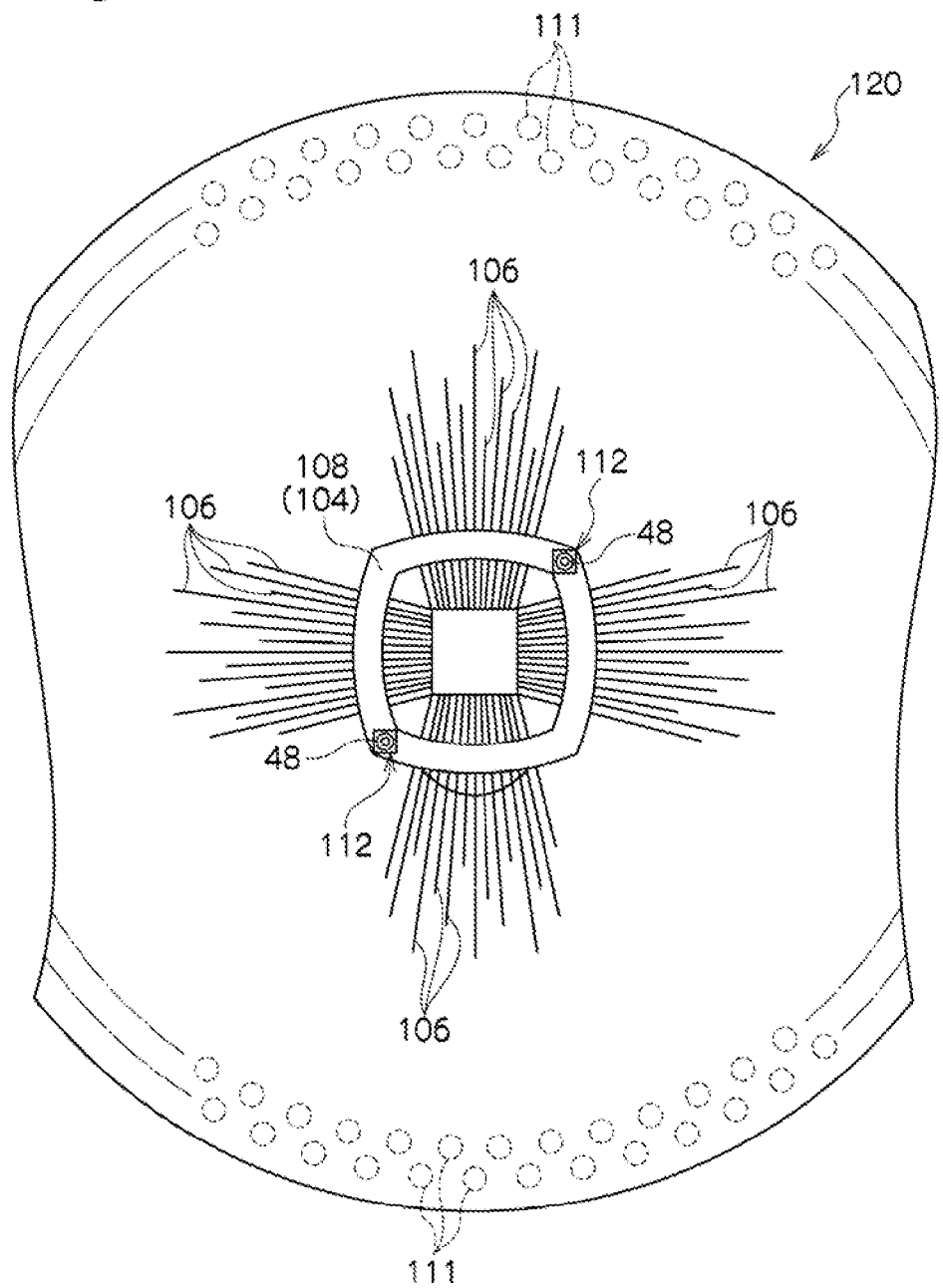
FIG. 9 is a bottom view showing a fourth embodiment of the electrical connecting apparatus.

FIG. 9 shows an embodiment of an electrical connecting apparatus 120 in which the mark units 112 are formed on the adhesive layer 108 in the aforementioned third embodiment of the electrical connecting apparatus, in which the same members as those in the connecting apparatus 100 are represented by the same reference signs.

In a fourth embodiment of the electrical connecting apparatus, the mark unit 112 is the same as one in the third embodiment of the electrical connecting apparatus except that it is provided on the adhesive layer 108 instead of the wiring board 102 in FIG. 8. The probe holder 104 and the adhesive layer 108 function as supporting bodies supporting the contacts 106 together with the wiring board 102.

As in the above case, the mark unit may be provided on any of the members other than the plate-shaped members such as the probe board, the probe block, the sheet-like board, the wiring board, or the like as long as it is located at a different position from a position at which the contacts are located so that light directed to the detecting unit 42 from the light source 46 may not be influenced by other members such as the contacts.

For example, in the fourth embodiment of the electrical connecting apparatus, the mark unit 112 may be provided on the lower surface of the probe holder 104. In this case, in FIG. 8, the member 102 functions as the probe holder 104, and a part of the adhesive layer 108 corresponding at least to the mark unit 112 is removed to become a coaxial through hole with the recess 118 or a transparent or semi-transparent area.

With regard to the mark 48 and the area 50, contrary to the above embodiments, the mark 48 may be an area that permits passing of light from the light source 46 while the area 50 adjacent to it may be an area that restricts or blocks passing of light from the light source 46, as shown in FIG. 10.

Figure 11:
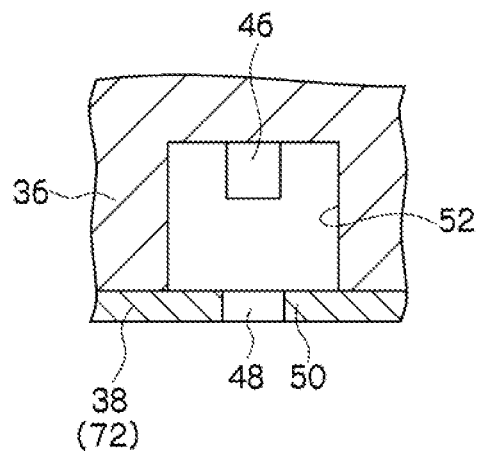
FIG. 11 is a vertical cross-sectional view showing a fourth embodiment of the mark and its surrounding.

In a case of the connecting apparatus using the sheet-like board such as the sheet-like board 38 or 72, instead of providing the sheet-like board with the mark member 44 having the mark 48 and the area 50 as in the above cases, the aforementioned mark 48 and area 50 may be formed in the sheet-like board 38 or 72 itself as shown in FIG. 11.

Also, the mark 48 may be formed in another shape such as a rectangle, an asterisk-like shape, a cross shape, or the like, not only a circular flat shape. An area adjacent to the mark 48 may be an area other than the ring-like area 50 surrounding the mark 48.

Figure 12:
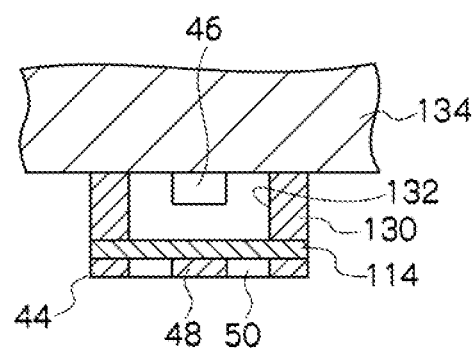
FIG. 12 is a vertical cross-sectional view showing a fifth embodiment of the mark and its surrounding.

Instead of forming the recess in which the light source 46 is arranged in the supporting body such as the ceramic board, the block, the wiring board, the probe holder, the adhesive layer, or the like, a short cylindrical member 130 may be arranged on the lower surface of a supporting body 134 in a state where its hollow portion 132 is in the up-down direction, and the hollow portion 132 may be a recess, as shown in FIG. 12.

In the example shown in FIG. 12, although the transparent sheet 114 and the mark member 44 shown in FIG. 8 are provided at the lower end of the cylindrical member 130, the mark member 44 shown in FIG. 11 may be provided at the lower end of the cylindrical member 130.

In the embodiment of the mark unit 112 shown in FIG. 8, a pattern corresponding to the mark 48 and the area 50 of the mark member 44 may be formed in the member 114 in FIG. 8. In this case, the member 114 may be transparent or non-transparent in accordance with whether the mark 48 is transparent or non-transparent. This facilitates manufacturing of the mark member 44.

In the above embodiments, the mark units 40 are provided at two locations spaced in the right-left direction with the arrangement area 58 or 92 of the contacts 32 in between. However, three or more mark units 40 may be provided.

The embodiments described here may be applied not only to the electrical connecting apparatuses in the above embodiments but also to connecting apparatuses having other shapes and structures such as a connecting apparatus in which contacts using fine metal wires are arranged in a state of extending in the up-down direction such as an electrical connecting apparatus described in WO2004-72661 (which is incorporated by reference), a connecting apparatus using pogo pins as contacts, and so on.

The described subject matter is not limited to the above embodiments but may be altered in various ways without departing from the spirit and scope presented here. Furthermore, where an alternative is disclosed for a particular embodiment, this alternative may also apply to other embodiments even if not specifically stated.

What is claimed is:

1. An electrical connecting apparatus, comprising:
a supporting body having a lower surface;
a plurality of contacts arranged on said lower surface of said supporting body;
a mark that is provided at a lower portion or a lower side of said supporting body and whose light passing feature differs from that of an area adjacent to said mark; and
a light source provided in said supporting body to irradiate said mark with incident light from an upper side of said mark;
wherein the differences between the amount of incident light transmitted from the light source through said mark and the amount of light transmitted from the light source through said area adjacent to said mark are detected;
wherein said supporting body has a recess opened toward said mark, and said light source is arranged in said recess;
wherein said supporting body includes a ceramic board and a sheet-like board having a lower surface on said contacts are arranged and arranged to be piled on a lower surface of said ceramic board, and
wherein said mark is provided on said lower surface of said sheet-like board, and said ceramic board has said recess.

2. The electrical connecting apparatus according to claim 1, wherein said supporting body includes a wiring board, a block having a lower surface projecting downward from said wiring board and supported on said wiring board, and a sheet-like board having a lower surface on which said contacts are supported and arranged below said wiring board and said block in a state where an upper surface of an area at which said contacts are arranged is opposed to said lower surface of said block, and
wherein said mark is provided on said lower surface of said sheet-like board, and said block has said recess.

3. The electrical connecting apparatus according to claim 1, wherein said supporting body includes a wiring board having a lower surface on which said contacts are supported, a probe holder arranged on said lower surface of said wiring board, and an adhesive layer attaching said contacts to said probe holder so as to support said contacts on said lower surface of said wiring board, and
wherein said mark is provided on said lower surface of said wiring board, and said wiring board has said recess.

4. The electrical connecting apparatus according to claim 1, wherein said supporting body includes a wiring board having a lower surface on which said contacts are supported, a probe holder arranged on said lower surface of said wiring board, and an adhesive layer attaching said contacts to said probe holder so as to support said contacts on said lower surface of said wiring board, and
wherein said mark is provided on said probe holder or said adhesive layer, and said probe holder or said adhesive layer provided with said mark has said recess.

5. The electrical connecting apparatus according to claim 1, wherein said sheet-like board has a second recess opened toward said recess of said ceramic board, and
wherein said mark is a sheet-like mark member arranged on said lower surface of said sheet-like board, and said mark is formed in said mark member in a state of being opposed to said second recess.

6. The electrical connecting apparatus according to claim 1, wherein said mark is formed in said sheet-like board in a state of being opposed to said recess of said ceramic board.

7. The electrical connecting apparatus according to claim 1, wherein said mark includes an area that permits passing of light from said light source, and said adjacent area restricts passing of light from said light source.

8. The electrical connecting apparatus according to claim 1, wherein said mark includes an area that restricts or blocks passing of light from said light source, and said adjacent area permits passing of light from said light source.

9. The electrical connecting apparatus according to claim 1, wherein said mark is located at a position in proximity to said contacts at which said contacts are not located.

10. The electrical connecting apparatus according to claim 1, wherein said mark is formed in a sheet-like mark member arranged on said lower surface of said supporting body.

11. An electrical connecting apparatus, comprising:
a supporting body having a lower surface;
a plurality of contacts arranged on the lower surface of the supporting body;
a mark that is provided on the supporting body, the mark having light passing features that differ from light passing features of areas on the supporting body adjacent to the mark; and
a light source provided in the supporting body, the light source operable to irradiate the mark with light from an upper side of the mark and a portion of the light being transmitted through the mark, the portion of the light transmitted through the mark being detectable when the supporting body is in a particular position;
wherein the mark comprises an alignment mark positioned in a center of the mark and operable to block the light from the light source;
wherein the mark comprises an area around the alignment mark that passes the light from the light source; and
wherein the mark comprises a mark member surrounding the area around the alignment mark and operable to block the light from the light source, and wherein the portion of the light being transmitted through the mark corresponds to light transmitted through the area around the alignment mark.

12. The electrical connecting apparatus of claim 11, wherein the alignment mark has a circular shape, the area around the alignment mark is an annular area, and the mark member has a rectangular shape.

13. The electrical connecting apparatus of claim 11, wherein the alignment mark is operable to block substantially all light from the light source that irradiates the upper side of the alignment mark.

14. The electrical connecting apparatus of claim 13, wherein the area around the alignment mark comprises either a transparent material operable to pass substantially all light from the light source that irradiates an upper side of the transparent material or a semi-transparent material operable to pass a portion of the light from the light source that irradiates an upper side of the semi-transparent material.

15. The electrical connecting apparatus of claim 14, wherein the mark includes an alignment mark having a first optical characteristic and an area surrounding the alignment mark having a second optical characteristic that enables the detection unit to distinguish the portion of incident light transmitted through the alignment mark from the portion of incident light transmitted through the area surrounding the alignment mark.

* * * * *

UNITED STATES PATENT AND TRADEMARK OFFICE
CERTIFICATE OF CORRECTION

| | | |
|---|---|---|
| PATENT NO. | : 8,643,393 B2 | Page 1 of 1 |
| APPLICATION NO. | : 12/708922 | |
| DATED | : February 4, 2014 | |
| INVENTOR(S) | : Ken Hasegawa et al. | |

It is certified that error appears in the above-identified patent and that said Letters Patent is hereby corrected as shown below:

In the Claims

In Claim 1, Column 13, line 33, of the patent, please insert the text -- which -- before the text "said contacts"

Signed and Sealed this
Twenty-fourth Day of February, 2015

Michelle K. Lee
*Deputy Director of the United States Patent and Trademark Office*